United States Patent
Storm et al.

(10) Patent No.: US 10,698,002 B2
(45) Date of Patent: Jun. 30, 2020

(54) PROBE SYSTEMS FOR TESTING A DEVICE UNDER TEST

(71) Applicant: FormFactor Beaverton, Inc., Beaverton, OR (US)

(72) Inventors: Christopher Storm, Hillsboro, OR (US); Michael E. Simmons, Colton, OR (US); Bryan Conrad Bolt, Beaverton, OR (US); Gavin Neil Fisher, Fenny Compton (GB); Anthony Lord, Banbury (GB); Kazuki Negishi, Beaverton, OR (US)

(73) Assignee: FormFactor Beaverton, Inc., Beaverton, OR (US)

( * ) Notice: Subject to any disclaimer, the term of this patent is extended or adjusted under 35 U.S.C. 154(b) by 97 days.

(21) Appl. No.: 16/143,856

(22) Filed: Sep. 27, 2018

(65) Prior Publication Data
US 2019/0101567 A1   Apr. 4, 2019

Related U.S. Application Data

(60) Provisional application No. 62/566,641, filed on Oct. 2, 2017.

(51) Int. Cl.
*G01R 1/06* (2006.01)
*G01R 1/067* (2006.01)
(Continued)

(52) U.S. Cl.
CPC ....... *G01R 1/06705* (2013.01); *G01R 1/0416* (2013.01); *G01R 1/06794* (2013.01);
(Continued)

(58) Field of Classification Search
CPC ............ G01R 31/2863; G01R 31/2874; G01R 31/2887
See application file for complete search history.

(56) References Cited

U.S. PATENT DOCUMENTS 3,710,251 A   1/1973   Hagge et al.
4,115,736 A   9/1978   Tracy
(Continued)

OTHER PUBLICATIONS

Micromanipulator Company, Inc., "Test Station Accessories," 1983.
(Continued)

*Primary Examiner* — Alvaro E Fortich
(74) *Attorney, Agent, or Firm* — Dascenzo Intellectual Property Law, P.C.

(57) ABSTRACT

Probe systems for testing a device under test are disclosed herein. The probe systems include a platen that defines an upper surface, an opposed lower surface, and a platen aperture. The probe systems also include a chuck that defines a support surface configured to support a device under test. The probe systems further include a lower enclosure extending from the lower surface of the platen and an upper enclosure extending from the upper surface of the platen. The upper enclosure includes a side wall that defines a side wall aperture, and the side wall and the platen define an intersection angle of at least 30 degrees and at most 60 degrees. The probe systems also include a manipulator, a probe shaft arm, a probe assembly, a test head, and an electrical conductor.

20 Claims, 5 Drawing Sheets

(51) Int. Cl.
*G01R 1/04* (2006.01)
*H01L 21/687* (2006.01)
*G01R 31/28* (2006.01)

(52) U.S. Cl.
CPC ..... *G01R 31/2863* (2013.01); *G01R 31/2865* (2013.01); *G01R 31/2874* (2013.01); *G01R 31/2887* (2013.01); *H01L 21/68785* (2013.01)

(56) References Cited

U.S. PATENT DOCUMENTS

| | | |
|---|---|---|
| 4,856,904 A | 8/1989 | Akagawa |
| 5,077,523 A | 12/1991 | Blanz |
| 5,266,889 A | 11/1993 | Harwood et al. |
| 5,345,170 A | 9/1994 | Schwindt et al. |
| 5,434,512 A | 7/1995 | Schwindt et al. |
| 5,457,398 A | 10/1995 | Schwindt et al. |
| 5,532,609 A | 7/1996 | Harwood et al. |
| 5,604,444 A | 2/1997 | Harwood et al. |
| 5,663,653 A | 9/1997 | Schwindt et al. |
| 6,232,788 B1 | 5/2001 | Schwindt et al. |
| 6,313,649 B2 | 11/2001 | Harwood et al. |
| 6,335,628 B2 | 1/2002 | Schwindt et al. |
| 6,380,751 B2 | 4/2002 | Harwood et al. |
| 6,486,687 B2 | 11/2002 | Harwood et al. |
| 6,492,822 B2 | 12/2002 | Schwindt et al. |
| 6,636,059 B2 | 10/2003 | Harwood et al. |
| 6,720,782 B2 | 4/2004 | Schwindt et al. |
| 6,801,047 B2 | 10/2004 | Harwood et al. |
| 6,980,012 B2 | 12/2005 | Schwindt et al. |
| 7,009,383 B2 | 3/2006 | Harwood et al. |
| 7,330,023 B2 | 2/2008 | Schwindt et al. |
| 7,348,787 B2 | 3/2008 | Harwood et al. |
| 7,492,147 B2 | 2/2009 | Schwindt et al. |
| 7,589,518 B2 | 9/2009 | Schwindt et al. |
| 7,595,632 B2 | 9/2009 | Harwood et al. |
| 9,784,763 B1 * | 10/2017 | Teich ................ G01R 1/18 |
| 2002/0075027 A1 | 6/2002 | Hollman et al. |
| 2011/0241711 A1 * | 10/2011 | Teich .............. G01R 31/2874 324/750.03 |
| 2013/0249581 A1 * | 9/2013 | Miyazono ........ G01R 31/2601 324/750.22 |
| 2017/0205446 A1 | 7/2017 | Simmons et al. |

OTHER PUBLICATIONS

Temptronic Corporation, "Application Note 1—Controlled Environment Enclosure for Low Temperature Wafer Probing in a Moisture-Free Environment," undated.

Temptronic Corporation, "Model TPO3000 Series Thermo Chuck Systems," undated.

Knauer, William, "Fixturing for Low-Current/Low-Voltage Parametric Testing," appearing in *Evaluation Engineering*, Nov. 1990, pp. 150-153.

Hewlett-Packard, "Application Note 356-HP 4142B Modular DC Source/Monitor Practical Application," (1987) pp. 1-4 (no month).

Hewlett-Packard, *H-P Model 4284A Precision LCR Meter, Operation Manual* (1991).

Yamamoto, Yousuke, "A Compact Self-Shielding Prober for Accurate Measurement of On-Wafer Electron Devices," appearing in IEEE Transactions on Instrumentation and Measurement, vol. 38, No. 6, Dec. 1989, pp. 1088-1093.

* cited by examiner

PROBE SYSTEMS FOR TESTING A DEVICE UNDER TEST

RELATED APPLICATION

This application claims priority to U.S. Provisional Patent Application No. 62/566,641, which is entitled PROBE SYSTEMS FOR TESTING A DEVICE UNDER TEST, was filed on Oct. 2, 2017, and the complete disclosure of which is hereby incorporated by reference.

FIELD OF THE DISCLOSURE

The present disclosure relates to probe systems for testing a device under test.

BACKGROUND OF THE DISCLOSURE

Probe systems may be utilized to test the operation, functionality, and/or performance of a device under test (DUT). Historically, as device performance improves, the operational frequency of the DUT increases. It may be desirable to test the DUT at frequencies that approach, are similar to, and/or are equal to, an intended operating frequency of the DUT. However, such testing presents many practical challenges. As an example, when the DUT is packaged and assembled within an electronic device, distances over which the DUT communicates with other components of the electronic device may be on the order of millimeters to centimeters. In contrast, spatial constraints often dictate that the distances over which probe systems communicate with the DUT may be on the order of 10's, or even 100's of centimeters. These spatial constraints are especially challenging when the probe system utilizes an enclosure to electrically, environmentally, and/or optically shield the DUT from an ambient environment that surrounds the probe system. Electrical losses, including insertion losses and power losses, and/or drift inherent to these greater communication distances may make it difficult, or even impossible, to test the DUT at frequencies that approach the intended operating frequency of the DUT. In addition, bent and/or twisted cables utilized to extend across these greater communication distances may produce undesired moding. Thus, there exists a need for improved probe systems for testing a device under test.

SUMMARY OF THE DISCLOSURE

Probe systems for testing a device under test are disclosed herein. The probe systems include a platen that defines an upper surface, an opposed lower surface, and a platen aperture. The probe systems also include a chuck that defines a support surface configured to support a device under test (DUT). The probe systems further include a lower enclosure extending from the lower surface of the platen and an upper enclosure extending from the upper surface of the platen. The lower enclosure and the lower surface of the platen together define a lower volume and the support surface of the chuck extends within the lower volume. The upper enclosure and the upper surface of the platen together define an upper volume, and the platen aperture extends between the upper volume and the lower volume. The upper enclosure includes a side wall that defines a side wall aperture, and the side wall and the platen define an intersection angle of at least 30 degrees and at most 60 degrees.

The probe systems also include a manipulator, a probe shaft arm, a probe assembly, a test head, and an electrical conductor. The manipulator is operatively attached to the upper surface of the platen and includes a probe shaft mount and a test head mount. The manipulator is configured to operatively translate a manipulated assembly along at least two at least substantially perpendicular axes. The manipulated assembly includes the probe shaft mount and the test head mount. The probe shaft aim defines a manipulator-proximal end and a manipulator-distal end. The probe shaft aim extends from the probe shaft mount and through the side wall aperture. The manipulator-distal end of the probe shaft aim defines a probe mount.

The probe assembly operatively attaches to the probe mount and includes a probe tip configured to contact the DUT. The probe assembly includes a probe electrical connection and at least a portion of the probe assembly extends through the platen aperture to facilitate contact between the probe tip and the DUT. The test head is operatively attached to the test head mount and defines a test head electrical connection. The test head is configured to provide a test signal to the test head electrical connection and/or to receive a resultant signal from the test head electrical connection. The electrical conductor extends through the side wall aperture and between the test head electrical connection and the probe electrical connection.

DETAILED DESCRIPTION AND BEST MODE OF THE DISCLOSURE

Figure 1:
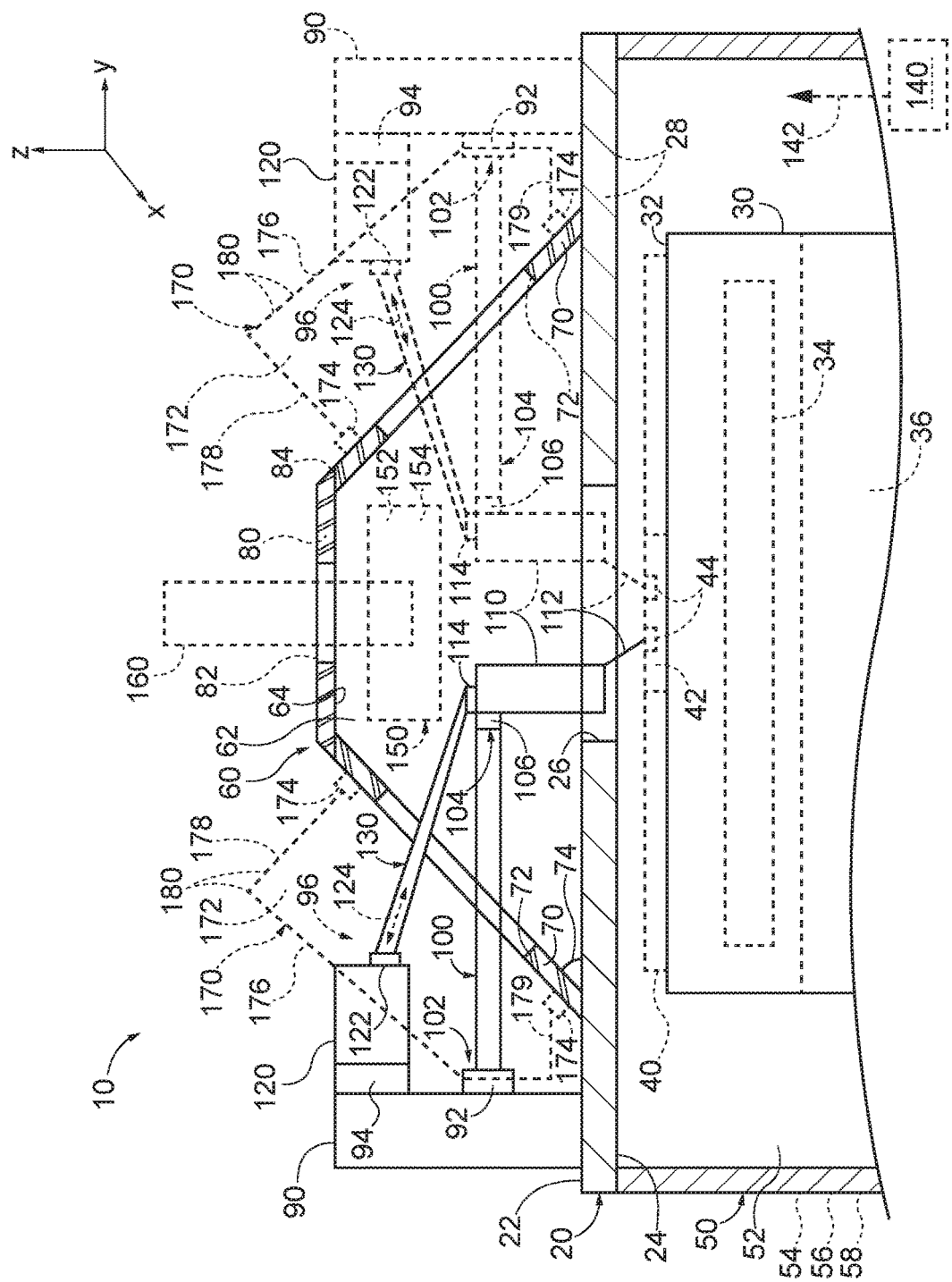
FIG. 1 is a schematic illustration of examples of probe systems according to the present disclosure.

FIGS. 1-5 provide examples of probe systems 10 and/or components thereof, according to the present disclosure. Elements that serve a similar, or at least substantially similar, purpose are labeled with like numbers in each of FIGS. 1-5, and these elements may not be discussed in detail herein with reference to each of FIGS. 1-5. Similarly, all elements may not be labeled in each of FIGS. 1-5, but reference numerals associated therewith may be utilized herein for consistency. Elements, components, and/or features that are discussed herein with reference to one or more of FIGS. 1-5 may be included in and/or utilized with any of FIGS. 1-5 without departing from the scope of the present disclosure. In general, elements that are likely to be included in a particular embodiment are illustrated in solid lines, while elements that are optional are illustrated in dashed lines. However, elements that are shown in solid lines may not be essential and, in some embodiments, may be omitted without departing from the scope of the present disclosure.

FIG. 1 is a schematic illustration of examples of probe systems 10 according to the present disclosure. FIGS. 2-5 are less schematic illustrations of examples of portions of probe systems 10 according to the present disclosure. As illustrated collectively by FIGS. 1-5, probe systems 10 include a platen 20 defining an upper surface 22, a lower surface 24, and a platen aperture 26 that extends between the upper surface and the lower surface. Probe systems 10 also include a chuck 30 that defines a support surface 32. Support surface 32 is configured to support a substrate 40 that includes, or has formed thereon, a device under test (DUT) 42.

Probe system 10 further includes a lower enclosure 50 and an upper enclosure 60. Lower enclosure 50 extends from lower surface 24 of platen 20, and lower enclosure 50 and platen 20 together define a lower volume 52 within which support surface 32 of chuck 30 extends. Upper enclosure 60 extends from upper surface 22 of platen 20, and upper enclosure 60 and platen 20 together define an upper volume 62. Upper enclosure 60 includes at least one side wall 70 that defines a side wall aperture 72. Side wall 70 and platen 20 define an intersection angle 74 therebetween. As perhaps best illustrated in FIG. 1, platen aperture 26 extends between lower volume 52 and upper volume 62. Stated another way, platen aperture 26 provides, or permits, fluid and/or mechanical communication between lower volume 52 and upper volume 62.

Probe systems 10 also include at least one manipulator 90, a least one probe shaft arm 100, at least one probe assembly 110, at least one test head 120, and at least one electrical conductor 130. As perhaps best illustrated in FIG. 1, manipulator 90 is operatively attached to upper surface 22 of platen 20 and includes a probe shaft mount 92 and a test head mount 94. Manipulator 90 is configured to operatively translate a manipulated assembly 96, which includes both probe shaft mount 92 and test head mount 94, as well as any structures that are attached thereto, relative to platen 20. This operative translation may be along at least two, or three, at least substantially perpendicular, or at least substantially orthogonal, axes, such as the X, Y, and/or Z-axes of FIG. 1.

Probe shaft arm 100 defines a manipulator-proximal end 102 and a manipulator-distal end 104. Probe shaft arm 100 is operatively attached to probe shaft mount 92 of manipulator 90 and extends from the probe shaft mount, through side wall aperture 72 of side wall 70, and into upper volume 62. Manipulator-distal end 104 of probe shaft arm 100 defines a probe mount 106. Probe shaft arm 100 also may be referred to herein as an elongate probe shaft arm 100 and/or as a round probe shaft arm 100.

Probe assembly 110 is operatively attached to probe mount 106 and includes a probe tip 112 that is configured to contact, to electrically contact, and/or to facilitate communication with, DUT 42. As an example, probe tip 112 may be configured to electrically contact a contact pad of DUT 42. Probe assembly 110 also includes a probe electrical connection 114. As illustrated, at least a portion of probe assembly 110 may extend through platen aperture 26 to facilitate contact between the probe tip and the DUT. Additionally or alternatively, at least probe tip 112 of probe assembly 110 may extend within lower volume 52.

Test head 120 is operatively attached to test head mount 94 of manipulator 90 and defines a test head electrical connection 122. In addition, test head 120 is configured to convey an electric signal 124 through the test head electrical connection. Electric signal 124 may include and/or be a test signal, which may be provided to the DUT, and/or a resultant signal, which may be received from the DUT. Stated another way, test head 120 may be configured to provide the test signal to the test head electrical connection and/or to receive the test signal from the test head electrical connection.

Test head mount 94 may include any suitable structure that may operatively attach test head 120 to manipulator 90. As an example, test head mount 94 may include and/or be a fixed test head mount. Such a fixed test head mount may utilize screws, bolts, and/or other fasteners to operatively attach the test head to the manipulator. As another example, test head mount 94 may include and/or be a quick release test head mount. Such a quick release test head mount may utilize levers, cams, and/or other quick release mechanisms to operatively attach the test head to the manipulator. Quick release test head mounts, when utilized, may permit and/or facilitate fast removal and/or installation of test head 120 into probe system 10, which may permit and/or facilitate faster replacement and/or calibration of the test head.

Electrical conductor 130 extends through side wall aperture 72 and between test head electrical connection 122 and probe electrical connection 114. Stated another way, electrical conductor 130 is configured to convey electric signal 124 between test head 120 and probe assembly 110.

During operation of probe system 10, substrate 40, including DUT 42, may be placed on and/or supported by support surface 32 of chuck 30. Then, one or more probe tips 112 may be operatively aligned with one or more contact locations 44 on DUT 42. This alignment may be in a plane of support surface 32 (e.g., the X-Y plane of FIG. 1) and may be accomplished via actuation of one or more corresponding manipulators 90. This alignment may be illustrated by a comparison between FIG. 2, in which probe tips 112 are aligned with DUT 42, and FIG. 3, in which probe tips 112 are not aligned with, or are misaligned with, DUT 42. Subsequently, probe tips 112 may be brought into contact with DUT 42.

Each manipulator 90 may be configured to operatively translate a corresponding manipulated assembly 96, and the corresponding manipulated assembly may include a corresponding probe shaft mount 92, a corresponding probe shaft arm 100, a corresponding probe assembly 110, a corresponding test head 120, and a corresponding electrical conductor 130. Stated another way, probe system 10 may be configured such that manipulators 90 move structures that are attached thereto (i.e., manipulated assemblies 96) as a unit. Stated yet another way, a relative orientation among the components of manipulated assemblies 96 may remain fixed, or at least substantially fixed, during the alignment.

Such a configuration may decrease a potential for a change in one or more electrical characteristics of the manipulated assembly during and/or due to the alignment process. In addition, the overall configuration of probe systems 10, including intersection angle 74 at which side walls 70 intersect platen 20, may permit and/or facilitate the alignment while, at the same time, also permitting and/or facilitating short distances between test head electrical connection 122 and probe electrical connection 114, relatively short electrical conductors 130, fixed, nominally linear, orientations of electrical conductors 130 throughout a range-of-motion of manipulators 90, the motion of manipulated assemblies 96 as a unit, and/or the fixed relative orientation among components of manipulated assemblies 96 during the alignment. The shorter length of the electrical conductor, together with the nominally fixed orientation thereof, may facilitate improved and/or more stable calibration of probe systems 10 and/or may facilitate electrical testing of DUTs 42 at higher frequencies when compared to prior art probe systems.

Upper enclosure 60 may include any suitable structure that may at least partially define upper volume 62 and/or that may include one or more side walls 70. As an example, and as illustrated, upper enclosure 60 may include a plurality of side walls 70. Examples of the plurality of side walls 70 include 3, 4, 5, 6, 7, 8, or more than 8 side walls 70. The plurality of side walls may form and/or define a pyramidal, or at least partially pyramidal, shape.

When upper enclosure 60 includes the plurality of side walls 70, at least 2 side walls 70 may include corresponding side wall apertures 72. Under these conditions, probe system 10 may include a corresponding manipulator 90, a corresponding probe shaft arm 100, a corresponding probe assembly 110, a corresponding test head 120, and/or a corresponding electrical conductor 130 for, or that may be associated with, each of the at least two side walls that include side wall apertures 72.

As discussed, side walls 70, or at least side walls 70 that include side wall aperture 72 configured to permit a corresponding probe shaft arm 100 and a corresponding electrical conductor 130 to pass therethrough, may define intersection angle 74 with platen 20. In general, intersection angle 74 is an acute angle; and this acute angle may permit and/or facilitate higher frequency testing of DUTs 42 via shorter lengths of electrical conductor 130 and/or fixed orientations for electrical conductor 130 when compared to prior art probe systems that do not include an acute intersection angle and/or that flex and/or bend a corresponding electrical conductor during alignment of probe tips 112. More specific examples of intersection angle 74 include intersection angles of at least 15 degrees, at least 20 degrees, at least 25 degrees, at least 30 degrees, at least 35 degrees, at least 40 degrees, at least 45 degrees, at least 50 degrees, at least 55 degrees, at least 60 degrees, at most 75 degrees, at most 70 degrees, at most 65 degrees, at most 60 degrees, at most 55 degrees, at most 50 degrees, at most 45 degrees, and/or nominally 45 degrees.

Intersection angle 74 may be measured, determined, and/or established in any suitable manner. As an example, intersection angle 74 may be measured between upper surface 22 of platen 20 and an interior 64 of upper enclosure 60 and/or of side wall 70 thereof. As another example, platen 20 may be a planar, or at least substantially planar, platen that extends within a platen plane. Similarly, side wall 70 may be a planar, or at least substantially planar, side wall that extends within a side wall plane. Under these conditions, intersection angle 74 may be measured between the platen plane and the side wall plane.

As illustrated in dashed lines in FIG. 1, upper enclosure 60 may include a viewing window 150. Viewing window 150, when present, may be configured to permit a user of probe system 10 to view probe assembly 110 and/or DUT 42 therethrough. As such, viewing window 150 may be, or may be referred to herein as, an optically transparent viewing window. Viewing window 150 may be formed from any suitable material and/or materials. As examples, viewing window 150 may include, may be formed from, and/or may be defined by a temperature-resistant window material, a window material with a low coefficient of thermal expansion, a glass, and/or a borosilicate glass.

It is within the scope of the present disclosure that viewing window 150, when present, may include an electromagnetic shielding structure 152. Examples of the electromagnetic shielding structure include an electromagnetic shielding coating, an optically transparent coating, and/or an electrically conductive coating. An example of such a coating includes an indium tin oxide coating. The electrically conductive coating, when present, may coat an internal surface of the viewing window (i.e., a surface of the viewing window that faces toward, or at least partially defines, upper volume 62) and/or an outer surface of the viewing window (i.e., a surface of the viewing window that faces away from upper volume 62 and/or is opposed to the internal surface of the viewing window) and may be connected to an electrical ground. Such a configuration may permit and/or facilitate dissipation of a static charge from the viewing window.

As illustrated in dashed lines in FIG. 1, probe system 10 further may include an optical cover 154. Optical cover 154, when present and/or utilized, may be configured to cover viewing window 150, such as to restrict light and/or electromagnetic radiation from passing through the viewing window from the ambient environment. Examples of optical cover 154 include an opaque cover, a metallic cover, and/or an aluminum cover.

As illustrated in dashed lines in FIG. 1 and in solid lines in FIGS. 2-5, upper enclosure 60 further may include an upper wall 80. Upper wall 80 also may be referred to herein as an upper cover 80 and/or as a cover 80. Upper wall 80, when present, may be opposed to, may be parallel to, and/or may be at least substantially parallel to platen 20. Stated another way, upper wall 80 may bound a first portion of upper volume 62 that is opposed to a second portion of the upper volume that is bounded by platen 20. As perhaps best illustrated in FIGS. 1 and 4-5, upper wall 80 may include and/or define an upper aperture 82. Upper aperture 82 may be shaped and/or configured to permit an optical assembly 160, such as a microscope, to view probe assembly 110 and/or DUT 42, such as via and/or through the upper aperture.

Figure 5:
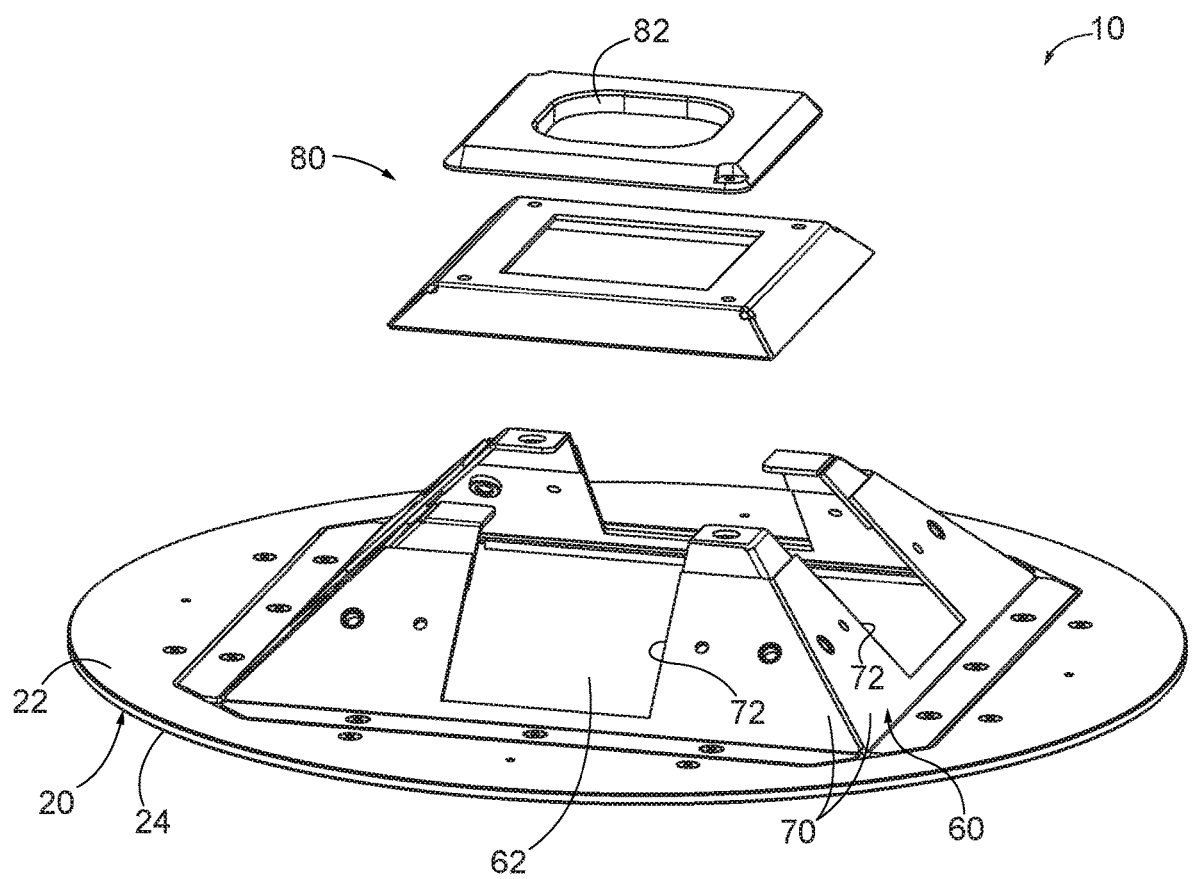
FIG. 5 is a less schematic illustration of an example of a portion of a probe system according to the present disclosure.

As perhaps best illustrated in FIG. 5, upper wall 80, when present, may be configured to be selectively and/or repeatedly separated from, and rejoined to, side wall 70, such as to provide access to probe assembly 110. Under these conditions, and as illustrated in FIG. 1, upper enclosure 60 further may include a sealing structure 84 that may be configured to form a fluid seal between the upper wall and the side wall. Examples of sealing structure 84 include any suitable flexible seal, resilient seal, foil seal, electrically conductive seal, and/or polymeric seal.

Additional examples of probe stations with controlled environment enclosures are disclosed in U.S. Pat. Nos. 5,266,889; 5,345,170; 5,457,398; 5,434,512; 5,532,609; 5,663,653; 5,604,444; 6,313,649; 6,232,788; 6,335,628; 6,380,751; 6,492,822; 6,486,687; 6,636,059; 6,720,782; 6,801,047; 6,980,012; 7,009,383; 7,589,518; 7,330,023; 7,348,787; 7,492,147; and 7,595,632. The complete disclosures of these patent documents are hereby incorporated by reference.

Figure 2:
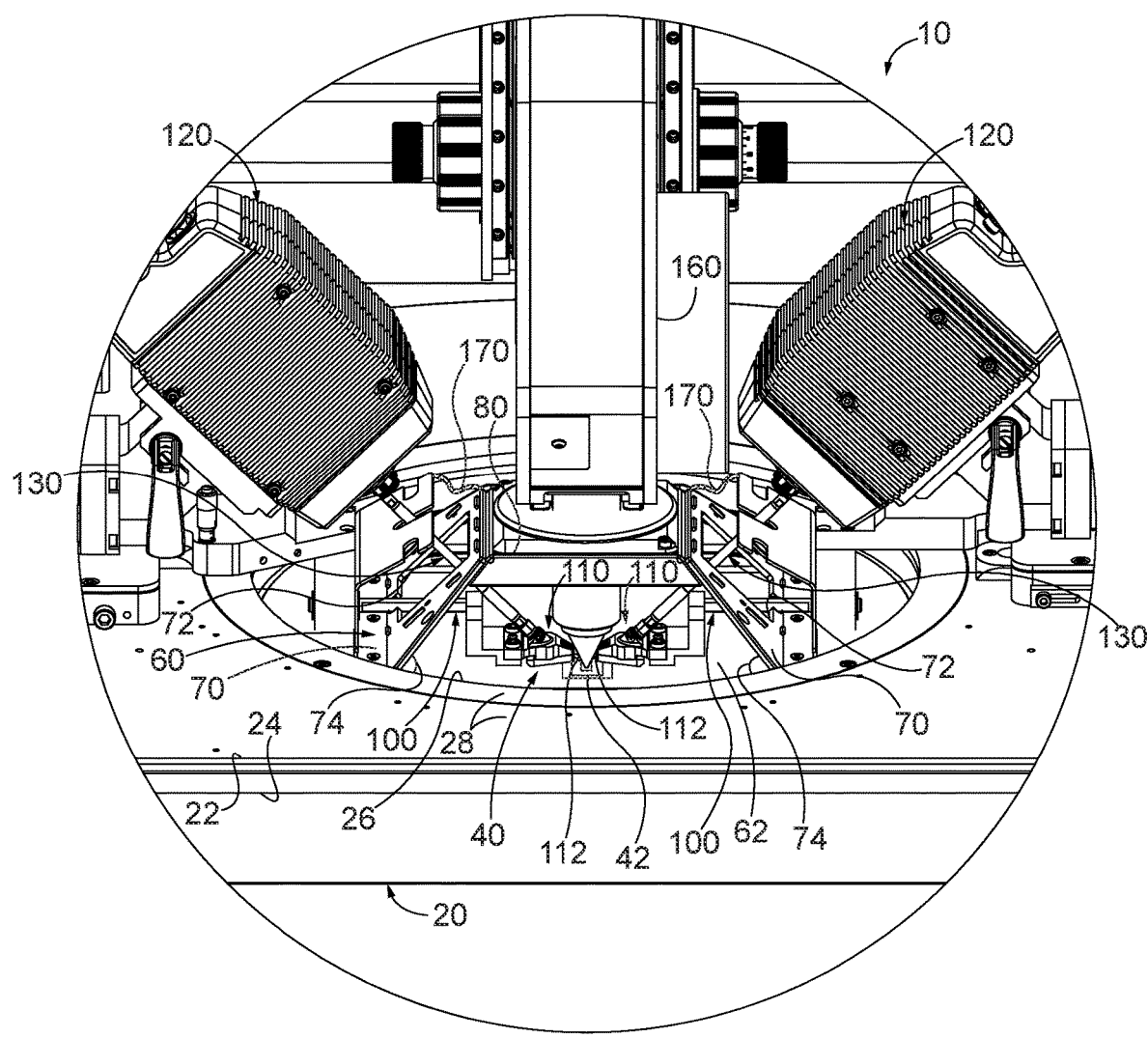
FIG. 2 is a less schematic illustration of an example of a portion of a probe system according to the present disclosure.
Figure 3:
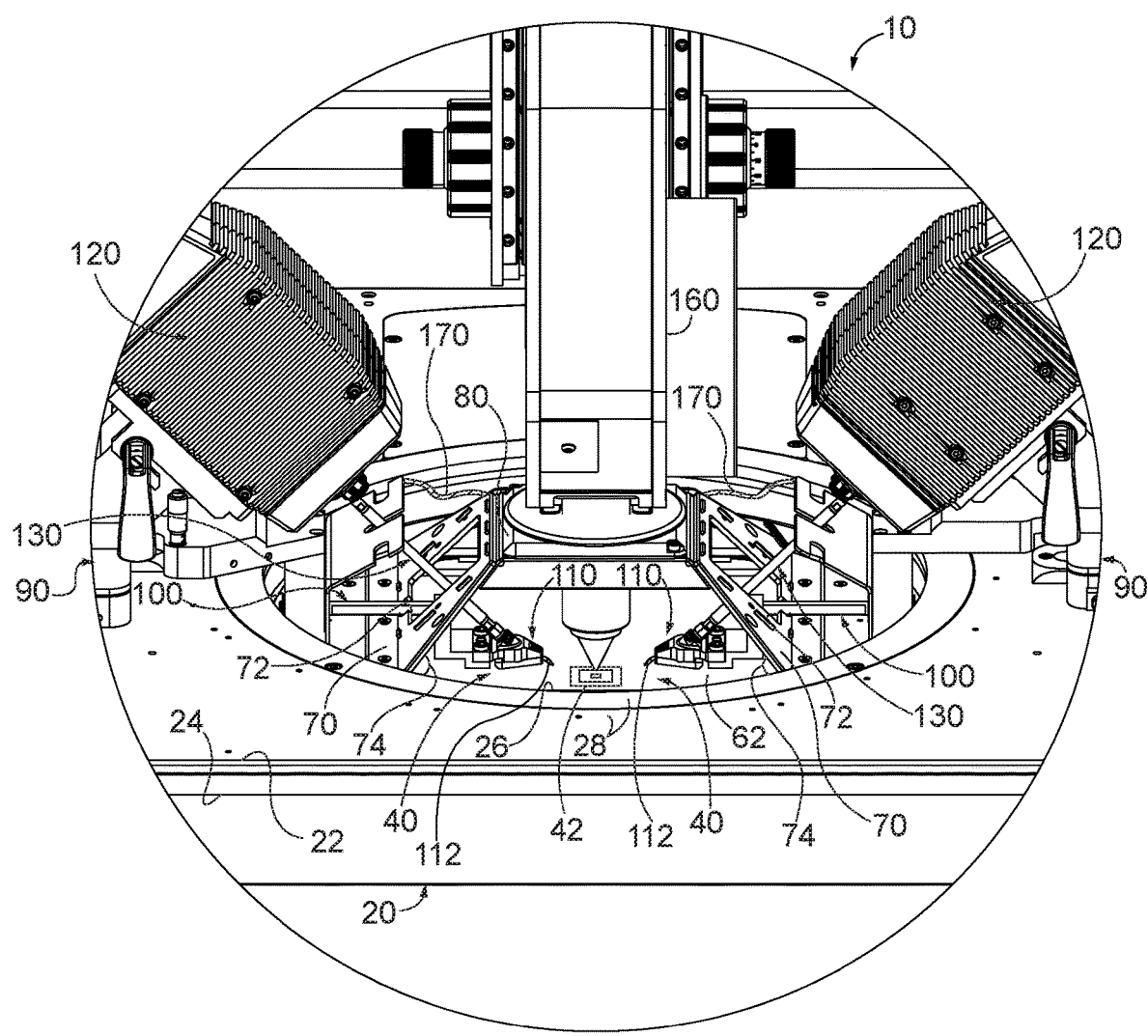
FIG. 3 is a less schematic illustration of an example of a portion of a probe system according to the present disclosure.
Figure 4:
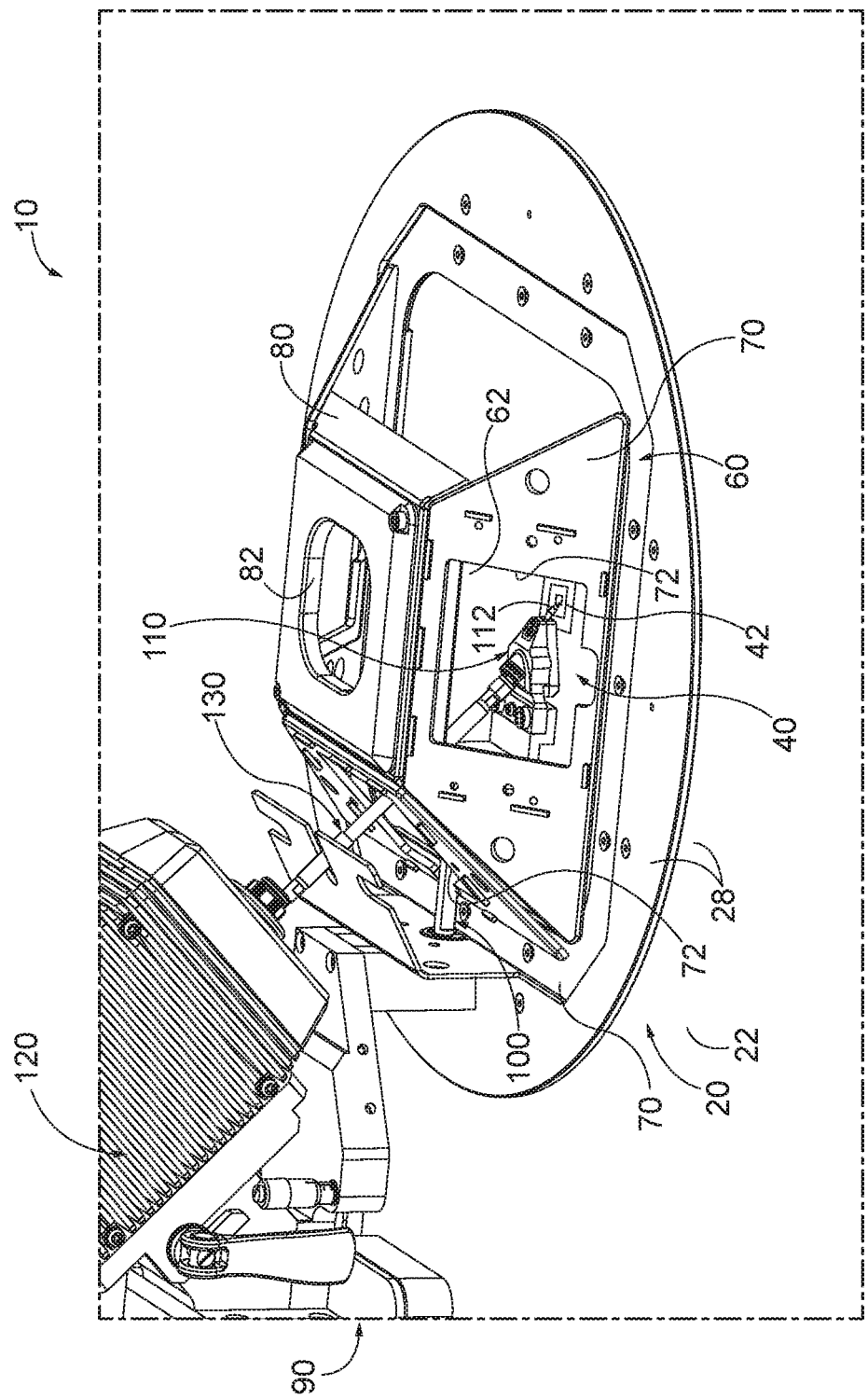
FIG. 4 is a less schematic illustration of an example of a portion of a probe system according to the present disclosure.

As illustrated in dashed lines in FIG. 1 and in solid lines in FIGS. 2-3, probe systems 10 also may include a flexible sealing assembly 170. Flexible sealing assembly 170, when present, may extend at least partially between manipulator 90 and upper enclosure 60 and may define a sealing assembly volume 172, as illustrated in FIG. 1. When probe systems 10 include flexible sealing assembly 170, probe shaft aim 100 and electrical conductor 130 both may extend at least partially within the sealing assembly volume.

Flexible sealing assembly 170, when present, may be configured to restrict entry of light, electromagnetic radiation, and/or ambient atmosphere into upper volume 62 via side wall aperture 72. Additionally or alternatively, flexible sealing assembly 170 may be configured to restrict transfer of thermal energy between the upper volume and the ambient environment via the side wall aperture.

Flexible sealing assembly 170 may include and/or be formed from any suitable material or materials. As examples, flexible sealing assembly 170 may include and/or be one or more of a polymeric flexible sealing assembly, a metallic flexible sealing assembly, a fabric flexible sealing assembly, and/or a bellows, or bellows-shaped, structure. As another example, the flexible sealing assembly may include a flexible main seal 178 and a flexible skirt seal 179 that is distinct and/or separate from the flexible main seal.

As a more specific example, flexible sealing assembly 170 may include a plurality of fabric sheets 180 that includes at least a first fabric sheet and a second fabric sheet. The plurality of fabric sheets may be arranged in a layered fashion. The first fabric sheet may be configured to absorb light, to restrict light transmission therethrough, and/or to restrict airflow therethrough. As examples, the first fabric sheet may have a tight weave, may be formed from a light-absorbing material, and/or may be black in color. The second fabric sheet may be configured to provide electromagnetic shielding. As examples, the second fabric sheet may be electrically conductive and/or may be metallic. The second fabric sheet may have a loose weave when compared to the first fabric sheet.

Flexible sealing assembly 170 may be operatively attached and/or affixed to upper enclosure 60 and/or to manipulator 90 in any suitable manner. As an example, upper enclosure 60 may be formed from a magnetic material and flexible sealing assembly 170 may be operatively attached to the upper enclosure via a magnetic flexible sealing assembly mount 174. As another example, the flexible sealing assembly may be operatively attached to manipulator 90 via a flexible sealing assembly mounting plate 176 that is operatively attached to the manipulator.

It is within the scope of the present disclosure that flexible sealing assembly 170, when present, may be shaped and/or configured to maintain at least a threshold spacing, or separation distance, from both probe shaft arm 100 and electrical conductor 130 throughout a range-of-motion of manipulator 90. Stated another way, flexible sealing assembly 170 may be configured not to touch, or contact, the probe shaft arm and/or the electrical conductor. Stated yet another way, flexible sealing assembly 170 may be configured to avoid contact with and/or avoid application of forces to probe shaft arm 100 and electrical conductor 130 when manipulator 90 is moved throughout its range-of-motion. Such a configuration may prevent the flexible sealing assembly from deflecting and/or bending the probe shaft arm and/or the electrical conductor. Flexible sealing assembly 170 additionally or alternatively may be configured to permit manipulator 90 to move throughout its range-of-motion without applying significant resisting and/or restraining forces to the manipulator. Such a configuration may decrease a potential for nonlinearity, deflection, delay, and/or hysteresis during motion of the manipulator.

Additional examples of flexible sealing assemblies are disclosed in U.S. Patent Application Publication No. 2017/0205466. The complete disclosure of this U.S. Patent Application Publication is hereby incorporated by reference.

Platen 20 may include any suitable structure that may define upper surface 22, lower surface 24, and/or platen aperture 26. Additionally or alternatively, platen 20 may include any suitable structure that may at least partially separate lower volume 52 and upper volume 62, that may have manipulator 90 attached thereto, that may be attached to lower enclosure 50, and/or that may be attached to upper enclosure 60. As examples, platen 20 may include a unitary platen or a platen assembly that includes a plurality of distinct platen components 28.

Chuck 30 may include any suitable structure that may define support surface 32, that may be configured to support substrate 40, and/or that may be configured to operatively translate and/or rotate substrate 40 relative to probe assembly 110. As an example, chuck 30 may include and/or have associated therewith a translation stage 36 that may be configured to selectively translate chuck 30 along the X, Y, and/or Z axes and/or to selectively rotate the chuck about the Z-axis.

It is within the scope of the present disclosure that probe systems 10 may be configured to test the operation of DUT 42 at various and/or defined temperatures that may be greater and/or less than an ambient temperature surrounding the probe system. Under these conditions, chuck 30 may include and/or be a thermal chuck that is configured to selectively regulate the temperature of the DUT. The thermal chuck may include a temperature control structure 34, which may be configured to selectively heat and/or cool the chuck to selectively regulate the temperature of the DUT.

Substrate 40 may include any suitable structure that may include DUT 42. Examples of substrate 40 include a semiconductor substrate, a silicon substrate, and/or a type III-V semiconductor substrate.

DUT 42 may include any suitable structure that may be configured to be contacted and/or tested by probe system 10. Examples of DUT 42 include any suitable semiconductor device, solid state device, logic device, micro-electro-mechanical system (MEMS) device, and/or power control device.

Lower enclosure 50 may include any suitable structure that may extend from lower surface 24 of platen 20 and/or that may at least partially define lower volume 52 and/or to at least partially restrict interaction between the lower volume and the ambient environment. As an example, lower enclosure 50 may include thermal shielding 54, which may be configured to thermally isolate the lower volume from the ambient environment. As another example, lower enclosure 50 may include electromagnetic shielding 56, which may be configured to electromagnetically isolate the lower volume from the ambient environment. As yet another example, lower enclosure 50 may include optical shielding 58, which may be configured to optically isolate the lower volume from the ambient environment. As another example, the lower enclosure may be configured to resist flow of ambient gas into the lower enclosure from the ambient environment.

Lower enclosure 50 may be formed and/or defined by any suitable material and/or materials. As examples, lower enclosure 50 may be formed from an electrically conductive material and/or a metallic material. When the lower enclosure is formed from the electrically conductive material, the lower enclosure further may be electrically grounded.

As illustrated in dashed lines in FIG. 1, probe system 10 may include a gas supply assembly 140, which may be configured to provide a gas stream 142 to lower volume 52. Such a configuration may restrict flow of ambient gas into the lower enclosure and/or may be utilized to produce and/or generate a desired environment within the lower volume. As an example, gas stream 142 may include and/or be a dry gas stream configured to produce a dry environment within the lower volume. Such a configuration may be utilized to decrease a potential for condensation and/or freezing of water on DUT 42 when the DUT is tested at low temperatures. As another example, gas stream 142 may include and/or be an inert gas stream configured to produce an inert environment within the lower volume. Such a configuration may decrease a potential for reaction with and/or oxidation of DUT 42 during testing thereof.

Manipulator 90 may include any suitable structure that may be operatively attached to upper surface 22 of platen 20, that may include probe shaft mount 92, that may include test head mount 94, and/or that may be configured to operatively translate the probe shaft mount and the test head mount. As discussed, manipulator 90 may be configured to maintain a fixed, or at least substantially fixed, relative orientation among probe shaft arm 100, probe assembly 110, test head 120, and electrical conductor 130 during operative translation thereof. As illustrated, manipulator 90 may be external to both upper volume 62 and lower volume 52. Examples of manipulator 90 include a manual manipulator and/or an electrically controlled manipulator. Manipulator 90 may include a ball screw and shaft assembly, a lead screw and shaft assembly, a micrometer assembly, a rack and pinion assembly, an electric motor, and/or a stepper motor.

Probe shaft aim 100 may include any suitable structure that may define manipulator-proximal end 102, that may define manipulator-distal end 104, and/or that may define probe mount 106. As illustrated, probe shaft arm 100 may extend at least partially external to upper volume 62 and at least partially within the upper volume. As also illustrated, probe shaft arm 100 may be external to lower volume 52. It is within the scope of the present disclosure that the probe shaft arm may be rigid, or at least substantially rigid, such as to resist deflection upon contact between probe assembly 110 and DUT 42.

Probe assembly 110 may include any suitable structure that may include probe tip 112 and/or probe electrical connection 114. As an example, and as discussed, probe assembly 110 may include and/or be a high-frequency probe assembly configured to convey high-frequency electric signals to and/or from DUT 42 and/or to test the operation of the DUT and high signal frequencies. As examples, the signal frequency may be at least 50 gigahertz (GHz), at least 75 GHz, at least 100 GHz, at least 110 GHz, at least 120 GHz, at least 130 GHz, at least 140 GHz, at least 150 GHz, at least 200 GHz, at least 250 GHz, at least 300 GHz, at least 350 GHz, at least 400 GHz, at least 450 GHz, and/or at least 500 GHz. As illustrated, probe assembly 110 may extend at least partially within platen aperture 26. Additionally or alternatively, probe assembly 110 may extend at least partially within both upper volume 62 and lower volume 52.

Test head 120 may include any suitable structure that may be operatively attached to test head mount 94, that may define test head electrical connection 122, and/or that may be configured to generate and/or receive electric signal 124. As an example, test head 120 may include and/or be a high-frequency test head configured to generate test signals at high signal frequencies, to provide test signals to the DUT at high signal frequencies, and/or to receive resultant signals from the DUT at high signal frequencies. Examples of the signal frequency are disclosed herein. As illustrated, test head 120 may be external to both upper volume 62 and lower volume 52.

Electrical conductor 130 may include any suitable structure that may be configured to extend through side wall aperture 72, to extend between test head electrical connection 122 and probe electrical connection 114, and/or to convey electric signals 124 between the probe assembly and the test head. Examples of electrical conductor 130 include an electric cable, a shielded cable, and a coaxial cable.

Electrical conductor 130 may be a high frequency electrical conductor configured to convey the electric signals at high signal frequencies, examples of which are disclosed herein. To facilitate the conveyance of electric signals at high signal frequencies and/or to provide a desired signals-to-noise ratio, electrical conductor 130 may be relatively short. As examples, a maximum length of electrical conductor 130 may be 15 centimeters (cm), 14 cm, 13 cm, 12 cm, 11 cm, 10 cm, 9 cm, 8 cm, 7 cm, 6 cm, and/or 5 cm. As discussed herein, this short length of electrical conductor 130 may provide a significant spatial constraint for probe systems 10; however, the overall configuration of probe systems 10, including the acute intersection angle 74 between side wall 70 and platen 20, may permit and/or facilitate utilization of electrical conductors 130 with the relatively short maximum lengths.

It is within the scope of the present disclosure that electrical conductor 130 may be straight, or at least substantially straight, as the electrical conductor extends between the probe electrical connection and the test head electrical connection. Stated another way, the electrical conductor may be linear, or at least substantially linear, and/or may extend on a linear trajectory between the test head electrical connection and the probe electrical connection. In addition, the shape of the electrical conductor may be fixed, or at least substantially fixed, throughout the range-of-motion of manipulator 90. Such a configuration may decrease a potential for changes in a calibration of probe systems 10 that may be caused by bending and/or deflection of the electrical conductor.

As used herein, the term "and/or" placed between a first entity and a second entity means one of (1) the first entity, (2) the second entity, and (3) the first entity and the second entity. Multiple entities listed with "and/or" should be construed in the same manner, i.e., "one or more" of the entities so conjoined. Other entities may optionally be present other than the entities specifically identified by the "and/or" clause, whether related or unrelated to those entities specifically identified. Thus, as a non-limiting example, a reference to "A and/or B," when used in conjunction with open-ended language such as "comprising" may refer, in one embodiment, to A only (optionally including entities other than B); in another embodiment, to B only (optionally including entities other than A); in yet another embodiment, to both A and B (optionally including other entities). These entities may refer to elements, actions, structures, steps, operations, values, and the like.

As used herein, the phrase "at least one," in reference to a list of one or more entities should be understood to mean at least one entity selected from any one or more of the entity in the list of entities, but not necessarily including at least one of each and every entity specifically listed within the list of entities and not excluding any combinations of entities in the list of entities. This definition also allows that entities may optionally be present other than the entities specifically identified within the list of entities to which the phrase "at least one" refers, whether related or unrelated to those entities specifically identified. Thus, as a non-limiting example, "at least one of A and B" (or, equivalently, "at least one of A or B," or, equivalently "at least one of A and/or B") may refer, in one embodiment, to at least one, optionally including more than one, A, with no B present (and optionally including entities other than B); in another embodiment, to at least one, optionally including more than one, B, with no A present (and optionally including entities other than A); in yet another embodiment, to at least one, optionally including more than one, A, and at least one, optionally including more than one, B (and optionally including other entities). In other words, the phrases "at least one," "one or more," and "and/or" are open-ended expressions that are both conjunctive and disjunctive in operation. For example, each of the expressions "at least one of A, B, and C," "at least one of A, B, or C," "one or more of A, B, and C," "one or more of A, B, or C" and "A, B, and/or C" may mean A alone, B alone, C alone, A and B together, A and C together, B and C together, A, B, and C together, and optionally any of the above in combination with at least one other entity.

In the event that any patents, patent applications, or other references are incorporated by reference herein and (1) define a term in a manner that is inconsistent with and/or (2) are otherwise inconsistent with, either the non-incorporated portion of the present disclosure or any of the other incorporated references, the non-incorporated portion of the present disclosure shall control, and the term or incorporated disclosure therein shall only control with respect to the reference in which the term is defined and/or the incorporated disclosure was present originally.

As used herein the terms "adapted" and "configured" mean that the element, component, or other subject matter is designed and/or intended to perform a given function. Thus, the use of the terms "adapted" and "configured" should not be construed to mean that a given element, component, or other subject matter is simply "capable of" performing a given function but that the element, component, and/or other subject matter is specifically selected, created, implemented, utilized, programmed, and/or designed for the purpose of performing the function. It is also within the scope of the present disclosure that elements, components, and/or other recited subject matter that is recited as being adapted to perform a particular function may additionally or alternatively be described as being configured to perform that function, and vice versa.

As used herein, the phrase, "for example," the phrase, "as an example," and/or simply the tell!' "example," when used with reference to one or more components, features, details, structures, embodiments, and/or methods according to the present disclosure, are intended to convey that the described component, feature, detail, structure, embodiment, and/or method is an illustrative, non-exclusive example of components, features, details, structures, embodiments, and/or methods according to the present disclosure. Thus, the described component, feature, detail, structure, embodiment, and/or method is not intended to be limiting, required, or exclusive/exhaustive; and other components, features, details, structures, embodiments, and/or methods, including structurally and/or functionally similar and/or equivalent components, features, details, structures, embodiments, and/or methods, are also within the scope of the present disclosure.

Illustrative, non-exclusive examples of probe systems according to the present disclosure are presented in the following enumerated paragraphs. It is within the scope of the present disclosure that an individual step of a method recited herein, including in the following enumerated paragraphs, may additionally or alternatively be referred to as a "step for" performing the recited action.

A1. A probe system comprising:

a platen defining an upper surface, an opposed lower surface, and a platen aperture extending between the upper surface and the lower surface;

a chuck defining a support surface configured to support a substrate that includes a device under test (DUT);

a lower enclosure extending from the lower surface of the platen, wherein the lower enclosure and the lower surface of the platen together define a lower volume, and further wherein the support surface of the chuck extends within the lower volume;

an upper enclosure extending from the upper surface of the platen, wherein the upper enclosure and the upper surface of the platen together define an upper volume, wherein the platen aperture extends between the upper volume and the lower volume, and further wherein the upper enclosure includes a side wall that defines a side wall aperture, wherein the side wall and the platen define an intersection angle of at least 10 degrees and at most 80 degrees;

a manipulator operatively attached to the upper surface of the platen and including a probe shaft mount and a test head mount, wherein the manipulator is configured to operatively translate a manipulated assembly, which includes both the probe shaft mount and the test head mount, relative to the platen along two at least substantially perpendicular translation axes;

a probe shaft aim defining a manipulator-proximal end and a manipulator-distal end, wherein the probe shaft arm extends from the probe shaft mount and through the side wall aperture, and further wherein the manipulator-distal end of the probe shaft arm defines a probe mount;

a probe assembly operatively attached to the probe mount and including a probe tip configured to contact the DUT, wherein the probe assembly includes a probe electrical connection, and further wherein at least a portion of the probe assembly extends through the platen aperture to facilitate contact between the probe tip and the DUT;

a test head operatively attached to the test head mount and defining a test head electrical connection, wherein the test head is configured to at least one of provide a test signal to the test head electrical connection and receive a resultant signal from the test head electrical connection; and an electrical conductor extending through the side wall aperture and between the test head electrical connection and the probe electrical connection.

A2. The probe system of paragraph A1, wherein the platen includes at least one of:

(i) a unitary platen; and (ii) a platen assembly that includes a plurality of distinct platen components.

A3. The probe system of any of paragraphs A1-A2, wherein the chuck is a thermal chuck configured to selectively regulate a temperature of the DUT.

A4. The probe system of paragraph A3, wherein the thermal chuck includes a temperature control structure configured to at least one of:

(i) selectively cool the chuck to selectively regulate the temperature of the DUT; and (ii) selectively heat the chuck to selectively regulate the temperature of the DUT.

A5. The probe system of any of paragraphs A1-A4, wherein the lower enclosure at least one of:

(i) includes thermal shielding configured to thermally isolate the lower volume from an ambient environment that surrounds the probe system;

(ii) includes electromagnetic shielding configured to electromagnetically isolate the lower volume from the ambient environment;

(iii) includes optical shielding configured to optically isolate the lower volume from the ambient environment; and (iv) is configured to resist flow of ambient gas into the lower enclosure from the ambient environment.

A6. The probe system of any of paragraphs A1-A5, wherein the lower enclosure is at least one of:

(i) an electrically conductive lower enclosure; and (ii) an electrically grounded lower enclosure.

A7. The probe system of any of paragraphs A1-A6, wherein the probe system further includes a gas supply assembly configured to provide a gas stream to the lower volume.

A8. The probe system of paragraph A7, wherein the gas stream includes at least one of a dry gas stream and an inert gas stream.

A9. The probe system of any of paragraphs A1-A8, wherein the upper enclosure includes a plurality of side walls.

A10. The probe system of paragraph A9, wherein at least two side walls in the plurality of side walls include corresponding side wall apertures, and further wherein the probe system includes a corresponding manipulator, a corresponding probe shaft arm, a corresponding probe assembly, a corresponding test head, and a corresponding electrical conductor associated with each of the at least two side walls.

A11. The probe system of any of paragraphs A9-A10, wherein the plurality of side walls includes four side walls.

A12. The probe system of any of paragraphs A9-A11, wherein the plurality of side walls defines an at least partially pyramidal shape.

A13. The probe system of any of paragraphs A1-A12, wherein the upper enclosure further includes a viewing window configured to permit a user of the probe system to view at least one of the probe assembly and the DUT through the viewing window.

A14. The probe system of paragraph A13, wherein the window is optically transparent.

A15. The probe system of any of paragraphs A13-A14, wherein the viewing window is formed from at least one of:
(i) a temperature-resistant window material;
(ii) a window material with a low coefficient of thermal expansion;
(iii) a glass; and
(iv) a borosilicate glass.

A16. The probe system of any of paragraphs A13-A15, wherein the viewing window includes an electromagnetic shielding structure.

A17. The probe system of paragraph A16, wherein the electromagnetic shielding structure includes at least one of:
(i) an optically transparent coating;
(ii) an electromagnetic shielding coating;
(iii) an electrically conductive coating; and
(iv) an indium tin oxide coating.

A18. The probe system of any of paragraphs A13-A17, wherein the probe system further includes an optical cover for the viewing window.

A19. The probe system of paragraph A18, wherein the optical cover includes at least one of:
(i) an opaque cover;
(ii) a metallic cover; and
(iii) an aluminum cover.

A20. The probe system of any of paragraphs A1-A19, wherein the upper enclosure further includes an upper wall.

A21. The probe system of paragraph A20, wherein the upper wall is parallel, or at least substantially parallel, to the platen.

A22. The probe system of any of paragraphs A20-A21, wherein the upper wall includes an upper aperture, and further wherein the probe system is configured to permit an optical assembly to view at least one of the probe assembly and the DUT via the upper aperture.

A23. The probe system of paragraph A22, wherein the probe system includes the optical assembly.

A24. The probe system of any of paragraphs A22-A23, wherein the optical assembly includes an optical microscope.

A25. The probe system of any of paragraphs A20-A24, wherein the upper wall is configured to be selectively and repeatedly separated from, and rejoined with, the side wall, optionally to provide access to the probe assembly.

A26. The probe system of any of paragraphs A20-A25, wherein the upper enclosure further includes a sealing structure configured to form a fluid seal between the upper wall and the side wall.

A27. The probe system of any of paragraphs A1-A26, wherein the intersection angle between the side wall and the platen is at least one of:
(i) at least 15 degrees, at least 20 degrees, at least 25 degrees, at least 30 degrees, at least 35 degrees, at least 40 degrees, at least 45 degrees, at least 50 degrees, at least 55 degrees, or at least 60 degrees;
(ii) at most 75 degrees, at most 70 degrees, at most 65 degrees, at most 60 degrees, at most 55 degrees, at most 50 degrees, or at most 45 degrees; and
(iii) nominally 45 degrees.

A28. The probe system of any of paragraphs A1-A27, wherein the intersection angle between the side wall and the platen is measured between the upper surface of the platen and an interior wall of the upper enclosure, which at least partially defines the upper volume.

A29. The probe system of any of paragraphs A1-A28, wherein the platen is a planar, or at least substantially planar, platen that extends within a platen plane, wherein the side wall is a planar, or at least substantially planar, side wall that extends within a side wall plane, and further wherein the intersection angle between the side wall and the platen is measured between the platen plane and the side wall plane.

A30. The probe system of any of paragraphs A1-A29, wherein the manipulator is at least one of:
(i) a manual manipulator; and
(ii) an electrically controlled manipulator.

A31. The probe system of any of paragraphs A1-A30, wherein the manipulator is configured to operatively translate both the probe shaft mount and the test head mount along three orthogonal, or at least substantially orthogonal, axes.

A32. The probe system of any of paragraphs A1-A31, wherein the manipulator is external to both the upper volume and the lower volume.

A33. The probe system of any of paragraphs A1-A32, wherein the manipulator is configured to maintain a fixed, or at least substantially fixed, relative orientation among the probe shaft arm, the probe assembly, the test head, and the electrical conductor during operative translation of the probe shaft mount and the test head mount.

A34. The probe system of any of paragraphs A1-A33, wherein the probe shaft arm is a rigid probe shaft arm.

A35. The probe system of any of paragraphs A1-A34, wherein the probe shaft arm extends at least partially external to the upper volume and at least partially within the upper volume.

A36. The probe system of any of paragraphs A1-A35, wherein the probe shaft arm is external to the lower volume.

A37. The probe system of any of paragraphs A1-A36, wherein the probe assembly is a high frequency probe assembly.

A38. The probe system of any of paragraphs A1-A37, wherein the probe assembly is configured to convey an electric signal, which includes at least one of the test signal and the resultant signal, at a frequency of at least 50 gigahertz (GHz), at least 75 GHz, at least 100 GHz, at least 110 GHz, at least 120 GHz, at least 130 GHz, at least 140 GHz, at least 150 GHz, at least 200 GHz, at least 250 GHz, at least 300 GHz, at least 350 GHz, at least 400 GHz, at least 450 GHz, or at least 500 GHz.

A39. The probe system of any of paragraphs A1-A38, wherein the probe assembly extends at least partially within both the upper volume and the lower volume.

A40. The probe system of any of paragraphs A1-A39, wherein the test head is a high frequency test head.

A41. The probe system of any of paragraphs A1-A40, wherein the test head is configured to at least one of generate the test signal and receive the resultant signal at a signal frequency of one of at least 50 gigahertz (GHz), at least 75 GHz, at least 100 GHz, at least 110 GHz, at least 120 GHz, at least 130 GHz, at least 140 GHz, at least 150 GHz, at least 200 GHz, at least 250 GHz, at least 300 GHz, at least 350 GHz, at least 400 GHz, at least 450 GHz, or at least 500 GHz.

A42. The probe system of any of paragraphs A1-A41, wherein the test head is external to both the upper volume and the lower volume.

A43. The probe system of any of paragraphs A1-A42, wherein the electrical conductor includes at least one of an electric cable, a shielded electric cable, and a coaxial cable.

A44. The probe system of any of paragraphs A1-A43, wherein the electrical conductor is a high frequency electrical conductor configured to convey an/the electric signal, which includes at least one of the test signal and the resultant signal, at a frequency of at least 50 gigahertz (GHz), at least 75 GHz, at least 100 GHz, at least 110 GHz, at least 120 GHz, at least 130 GHz, at least 140 GHz, at least 150 GHz, at least 200 GHz, at least 250 GHz, at least 300 GHz, at least 350 GHz, at least 400 GHz, at least 450 GHz, or at least 500 GHz.

A45. The probe system of any of paragraphs A1-A44, wherein the electrical conductor has a maximum length of one of 15 centimeters (cm), 14 cm, 13 cm, 12 cm, 11 cm, 10 cm, 9 cm, 8 cm, 7 cm, 6 cm, or 5 cm.

A46. The probe system of any of paragraphs A1-A45, wherein the electrical conductor at least one of:

(i) is straight, or at least substantially straight;

(ii) is linear, or at least substantially linear; and (iii) extends along a linear trajectory between the test head electrical connection and the probe electrical connection.

A47. The probe system of any of paragraphs A1-A46, wherein the probe system further includes a flexible sealing assembly extending between the manipulator and the upper enclosure, wherein the flexible sealing assembly at least partially defines a sealing assembly volume, and further wherein both the probe shaft arm and the electrical conductor extend at least partially within the sealing assembly volume.

A48. The probe system of paragraph A47, wherein the flexible sealing assembly is configured to at least one of:

(i) restrict entry of light into the upper volume via the side wall aperture;

(ii) restrict entry of electromagnetic radiation into the upper volume via the side wall aperture;

(iii) restrict entry of ambient atmosphere into the upper volume via the side wall aperture;

(iv) restrict transfer of thermal energy between the upper volume and an/the ambient environment via the side wall aperture; and (v) absorb light.

A49. The probe system of any of paragraphs A47-A48, wherein the flexible sealing assembly includes at least one of:

(i) a polymeric flexible sealing assembly;

(ii) a metallic flexible sealing assembly;

(iii) a fabric flexible sealing assembly; and (iv) a bellows structure.

A50. The probe system of any of paragraphs A47-A49, wherein the flexible sealing assembly is operatively attached to the upper enclosure, optionally via a magnetic flexible sealing assembly mount.

A51. The probe system of any of paragraphs A47-A50, wherein the flexible sealing assembly is operatively attached to the manipulator, optionally via a flexible sealing assembly mounting plate that is operatively attached to the manipulator.

A52. The probe system of any of paragraphs A47-A51, wherein the flexible sealing assembly is configured to maintain at least a threshold separation distance from both the probe shaft arm and the electrical conductor throughout a range-of-motion of the manipulator.

A53. The probe system of any of paragraphs A47-A52, wherein the flexible sealing assembly includes a flexible main seal and a flexible skirt seal that is distinct from the flexible main seal.

INDUSTRIAL APPLICABILITY

The probe systems disclosed herein are applicable to the semiconductor manufacturing and test industries.

It is believed that the disclosure set forth above encompasses multiple distinct inventions with independent utility. While each of these inventions has been disclosed in its preferred form, the specific embodiments thereof as disclosed and illustrated herein are not to be considered in a limiting sense as numerous variations are possible. The subject matter of the inventions includes all novel and non-obvious combinations and subcombinations of the various elements, features, functions and/or properties disclosed herein. Similarly, when the disclosure, the preceding numbered paragraphs, or subsequently filed claims recite "a" or "a first" element or the equivalent thereof, such claims should be understood to include incorporation of one or more such elements, neither requiring nor excluding two or more such elements.

It is believed that the disclosure set forth above encompasses multiple distinct inventions with independent utility. While each of these inventions has been disclosed in its preferred form, the specific embodiments thereof as disclosed and illustrated herein are not to be considered in a limiting sense as numerous variations are possible. The subject matter of the inventions includes all novel and non-obvious combinations and subcombinations of the various elements, features, functions and/or properties disclosed herein. Similarly, where the claims recite "a" or "a first" element or the equivalent thereof, such claims should be understood to include incorporation of one or more such elements, neither requiring nor excluding two or more such elements.

It is believed that the following claims particularly point out certain combinations and subcombinations that are directed to one of the disclosed inventions and are novel and non-obvious. Inventions embodied in other combinations and subcombinations of features, functions, elements and/or properties may be claimed through amendment of the present claims or presentation of new claims in this or a related application. Such amended or new claims, whether they are directed to a different invention or directed to the same invention, whether different, broader, narrower, or equal in scope to the original claims, are also regarded as included within the subject matter of the inventions of the present disclosure.

The invention claimed is:

1. A probe system comprising:
a platen defining an upper surface, an opposed lower surface, and a platen aperture extending between the upper surface and the lower surface;
a chuck defining a support surface configured to support a substrate that includes a device under test (DUT);
a lower enclosure extending from the lower surface of the platen, wherein the lower enclosure and the lower surface of the platen together define a lower volume, and further wherein the support surface of the chuck extends within the lower volume;
an upper enclosure extending from the upper surface of the platen, wherein the upper enclosure and the upper surface of the platen together define an upper volume, wherein the platen aperture extends between the upper volume and the lower volume, and further wherein the upper enclosure includes a side wall that defines a side wall aperture, wherein the side wall and the platen define an intersection angle of at least 30 degrees and at most 60 degrees;
a manipulator operatively attached to the upper surface of the platen and including a probe shaft mount and a test head mount, wherein the manipulator is configured to operatively translate a manipulated assembly, which includes both the probe shaft mount and the test head mount, relative to the platen along two at least substantially perpendicular translation axes;
a probe shaft arm defining a manipulator-proximal end and a manipulator-distal end, wherein the probe shaft arm extends from the probe shaft mount and through the side wall aperture, and further wherein the manipulator-distal end of the probe shaft arm defines a probe mount;
a probe assembly operatively attached to the probe mount and including a probe tip configured to contact the DUT, wherein the probe assembly includes a probe electrical connection, and further wherein at least a portion of the probe assembly extends through the platen aperture to facilitate contact between the probe tip and the DUT;
a test head operatively attached to the test head mount and defining a test head electrical connection, wherein the test head is configured to at least one of provide a test signal to the test head electrical connection and receive a resultant signal from the test head electrical connection; and
an electrical conductor extending through the side wall aperture and between the test head electrical connection and the probe electrical connection.

2. The probe system of claim 1, wherein the upper enclosure includes a plurality of side walls.

3. The probe system of claim 2, wherein at least two side walls in the plurality of side walls include corresponding side wall apertures, and further wherein the probe system includes a corresponding manipulator, a corresponding probe shaft arm, a corresponding probe assembly, a corresponding test head, and a corresponding electrical conductor associated with each of the at least two side walls.

4. The probe system of claim 2, wherein the plurality of side walls defines an at least partially pyramidal shape.

5. The probe system of claim 1, wherein the upper enclosure further includes a viewing window configured to permit a user of the probe system to view at least one of the probe assembly and the DUT through the viewing window.

6. The probe system of claim 5, wherein the viewing window includes an electromagnetic shielding structure.

7. The probe system of claim 5, wherein the probe system further includes an optical cover for the viewing window.

8. The probe system of claim 1, wherein the upper enclosure further includes an upper wall.

9. The probe system of claim 8, wherein the upper wall includes an upper aperture, wherein the probe system is configured to permit an optical assembly to view at least one of the probe assembly and the DUT via the upper aperture, and further wherein the probe system includes the optical assembly.

10. The probe system of claim 8, wherein the upper enclosure further includes a sealing structure configured to form a fluid seal between the upper wall and the side wall.

11. The probe system of claim 1, wherein the intersection angle between the side wall and the platen is at least 40 degrees and at most 50 degrees.

12. The probe system of claim 1, wherein the manipulator is configured to operatively translate both the probe shaft mount and the test head mount along three at least substantially orthogonal axes.

13. The probe system of claim 1, wherein the manipulator is configured to maintain an at least substantially fixed relative orientation among the probe shaft arm, the probe assembly, the test head, and the electrical conductor during operative translation of the probe shaft mount and the test head mount.

14. The probe system of claim 1, wherein the probe shaft arm extends at least partially external to the upper volume and at least partially within the upper volume.

15. The probe system of claim 1, wherein:
(i) the probe assembly is configured to convey an electric signal, which includes at least one of the test signal and the resultant signal, at a frequency of at least 50 gigahertz (GHz);
(ii) the test head is configured to at least one of generate the test signal and receive the resultant signal at a signal frequency of one of at least 50 GHz; and
(iii) the electrical conductor is a high frequency electrical conductor configured to convey the electric signal at the frequency of at least 50 GHz.

16. The probe system of claim 1, wherein the probe assembly extends at least partially within both the upper volume and the lower volume.

17. The probe system of claim 1, wherein the test head is external to both the upper volume and the lower volume.

18. The probe system of claim 1, wherein the electrical conductor has a maximum length of 15 centimeters.

19. The probe system of claim 1, wherein the electrical conductor extends along a linear trajectory between the test head electrical connection and the probe electrical connection.

20. The probe system of claim 1, wherein the probe system further includes a flexible sealing assembly extending between the manipulator and the upper enclosure, wherein the flexible sealing assembly at least partially defines a sealing assembly volume, and further wherein both the probe shaft arm and the electrical conductor extend at least partially within the sealing assembly volume.

* * * * *